(12) United States Patent
Lim

(10) Patent No.: US 8,159,831 B2
(45) Date of Patent: Apr. 17, 2012

(54) PRINTED CIRCUIT BOARD FOR ACCOMPLISHING NARROW SCRIBE LANE AND SEMICONDUCTOR PACKAGE INCLUDING THE PRINTED CIRCUIT BOARD

(75) Inventor: Won-Chul Lim, Chungcheongnam-do (KR)

(73) Assignee: Samsung Electronics Co., Ltd., Maetan-dong, Yeongtong-gu, Suwon-si, Gyeonggi-do (KR)

( * ) Notice: Subject to any disclaimer, the term of this patent is extended or adjusted under 35 U.S.C. 154(b) by 550 days.

(21) Appl. No.: 12/348,175

(22) Filed: Jan. 2, 2009

(65) Prior Publication Data

US 2010/0014264 A1    Jan. 21, 2010

(30) Foreign Application Priority Data

Jul. 17, 2008  (KR) .......................... 10-2008-0069740

(51) Int. Cl.
*H05K 7/00* (2006.01)
(52) U.S. Cl. ........................................ 361/783; 174/261
(58) Field of Classification Search .......... 174/260–262; 361/760, 784, 764; 29/412, 414, 415, 417, 29/825, 830–832; 257/690–692, 698
See application file for complete search history.

(56) References Cited

U.S. PATENT DOCUMENTS

| 6,319,750 | B1 * | 11/2001 | Huang et al. | 438/106 |
| 7,065,869 | B2 * | 6/2006 | Kang et al. | 29/847 |
| 7,443,010 | B2 * | 10/2008 | Tsao et al. | 257/620 |
| 7,611,927 | B2 * | 11/2009 | Liao et al. | 438/140 |
| 7,746,656 | B2 * | 6/2010 | Shim et al. | 361/760 |

FOREIGN PATENT DOCUMENTS

| JP | 3107043 | 8/2004 |
| KR | 2003-0034514 | 5/2003 |

OTHER PUBLICATIONS

English language abstract of Korean Publication No. 2003-0034514.
English language abstract of Japanese Publication No. 3107043.

* cited by examiner

*Primary Examiner* — Yuriy Semenenko
(74) *Attorney, Agent, or Firm* — Muir Patent Consulting, PLLC

(57) ABSTRACT

A PCB (printed circuit board) for manufacturing a semiconductor package. The PCB includes a plurality of semiconductor package unit frames; a scribe lane dividing the plurality of semiconductor package unit frames; and a printed circuit pattern for plating directly connected to a plurality of bond fingers on the semiconductor package unit frames and disposed to cross the scribe lane between adjacent semiconductor package unit frames.

20 Claims, 6 Drawing Sheets

PRINTED CIRCUIT BOARD FOR ACCOMPLISHING NARROW SCRIBE LANE AND SEMICONDUCTOR PACKAGE INCLUDING THE PRINTED CIRCUIT BOARD

CROSS-REFERENCE TO RELATED APPLICATIONS

This application claims the benefit of Korean Patent Application No. 10-2008-0069740, filed on Jul. 17, 2008, in the Korean Intellectual Property Office, the disclosure of which is incorporated herein in its entirety by reference.

BACKGROUND

This disclosure relates to a printed circuit board (PCB) and a semiconductor packaging including the PCB which is used in a semiconductor package manufacturing process, and more particularly, to a PCB and a semiconductor package including the PCB which is used in a ball grid array (BGA) semiconductor package having a chip-scale package (CSP) that is 1.2 times larger than a semiconductor chip.

Semiconductor packages have been developed to both protect an internal semiconductor chip and to expose electrical functions of the semiconductor chip. However, electronic products such as mobile phones, computers, and various kinds of medical electronic equipments, which employ a semiconductor package, have become thin and more compact. Accordingly, improved semiconductor packages, such as a BGA semiconductor package, a CSP, a multi-chip package (MCP), a system in package (SIP), and the like, have been introduced. An external shape of such semiconductor packages has become thin and more compact. In addition a size of a semiconductor chip in the semiconductor package has decreased since the semiconductor chip is highly integrated in a wafer manufacturing process, and the number of input/output (I/O) terminals included in the semiconductor chip substantially has increased. As a result, the semiconductor package has many unresolved issues since the number of pins in an external connecting terminal rapidly increased.

A manufacturing process of the BGA semiconductor package forms a plurality of semiconductor packages on a matrix type PCB in which a plurality of semiconductor package unit frames are matrix-arrayed, and divides the semiconductor packages into a unit BGA semiconductor package by using a saw blade. At this time, the semiconductor package unit frames for the manufacture of a semiconductor package in the matrix type PCB are divided from each other along a scribe lane. Here, the scribe lane is a lane where the saw blade passes, and thus, it is also called a saw line. Also, each of the semiconductor package unit frames internally includes a bond finger, a via land, a solder ball pad, and a printed circuit pattern. The bond finger represents a passage electrically connected to a semiconductor chip via a wire or a bump, the via land represents a through electrode that connects printed circuit patterns which are disposed on top and bottom surfaces in each of the semiconductor package unit frames, and the solder ball pad represents an area in which solder balls are attached in each of the semiconductor package unit frames.

SUMMARY

An embodiment includes a PCB (printed circuit board) for manufacturing a semiconductor package. The PCB includes a plurality of semiconductor package unit frames; a scribe lane dividing the plurality of semiconductor package unit frames; and a printed circuit pattern for plating directly connected to a plurality of bond fingers on the semiconductor package unit frames and disposed to cross the scribe lane between adjacent semiconductor package unit frames.

Another embodiment includes a semiconductor package including a semiconductor package unit frame obtained by laser cutting a PCB; a semiconductor chip mounted on a top surface of the semiconductor package unit frame; a plurality of conductors that connect bond pads of the semiconductor chip and a plurality of bond fingers of the semiconductor package unit frame; and a plurality of solder balls attached on a solder ball pad on a bottom surface of the semiconductor package unit frame.

Another embodiment includes a semiconductor package including a semiconductor package unit frame obtained by laser cutting a PCB; a semiconductor chip mounted on a plurality of bond fingers via a plurality of bumps so as to be arranged on a top surface of the semiconductor package unit frame; and a plurality of solder balls attached on a solder ball pad on a bottom surface of the semiconductor package unit frame.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Hereinafter, embodiments will be described in detail with reference to the attached drawings. These embodiments are provided so that this disclosure will be thorough and complete, and will fully convey the scope to those of ordinary skill in the art.

Figure 1:
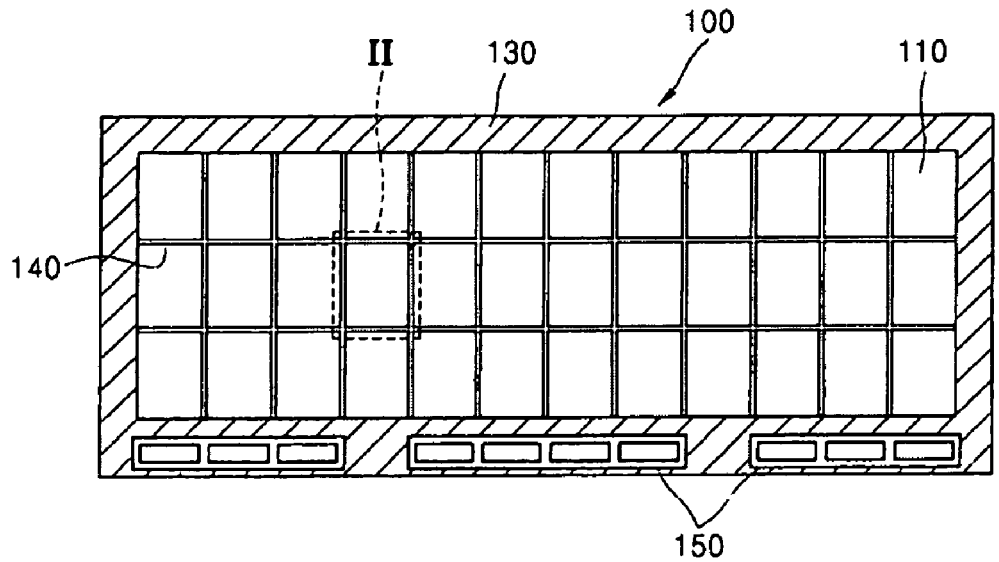
FIG. 1 is a plane view of a matrix type printed circuit board (PCB) having a saw line with a narrow width, according to an embodiment.

FIG. 1 is a plane view of a matrix type printed circuit board (PCB) 100 having a saw line with a narrow width, according to an embodiment. The matrix type PCB 100, which is generally used in the manufacture of a ball grid array (BGA) semiconductor package, is classified into a flexible PCB such as a substrate formed of a polyimide material, and a rigid PCB formed of a rigid material such as FR4 resin. The matrix type PCB 100 according to the current embodiment may be formed of a rigid material and may have a double-layered structure or a multi-layered structure, wherein a printed circuit pattern is formed on each layer.

The matrix type PCB 100 according to an embodiment uses an insulating substrate 130, which can be rigid due to FR4 resin, for example, as a base. On the matrix type PCB 100, semiconductor package unit frames 110 are matrix-arrayed so that printed circuit patterns, each assembling a semiconductor package, are respectively formed in the semiconductor package unit frames 110. The semiconductor package unit frames 110 are horizontally and vertically divided from each other by a scribe lane 140. In a lower end of the insulating substrate 130, product information display units 150 are arranged.

Figure 2:
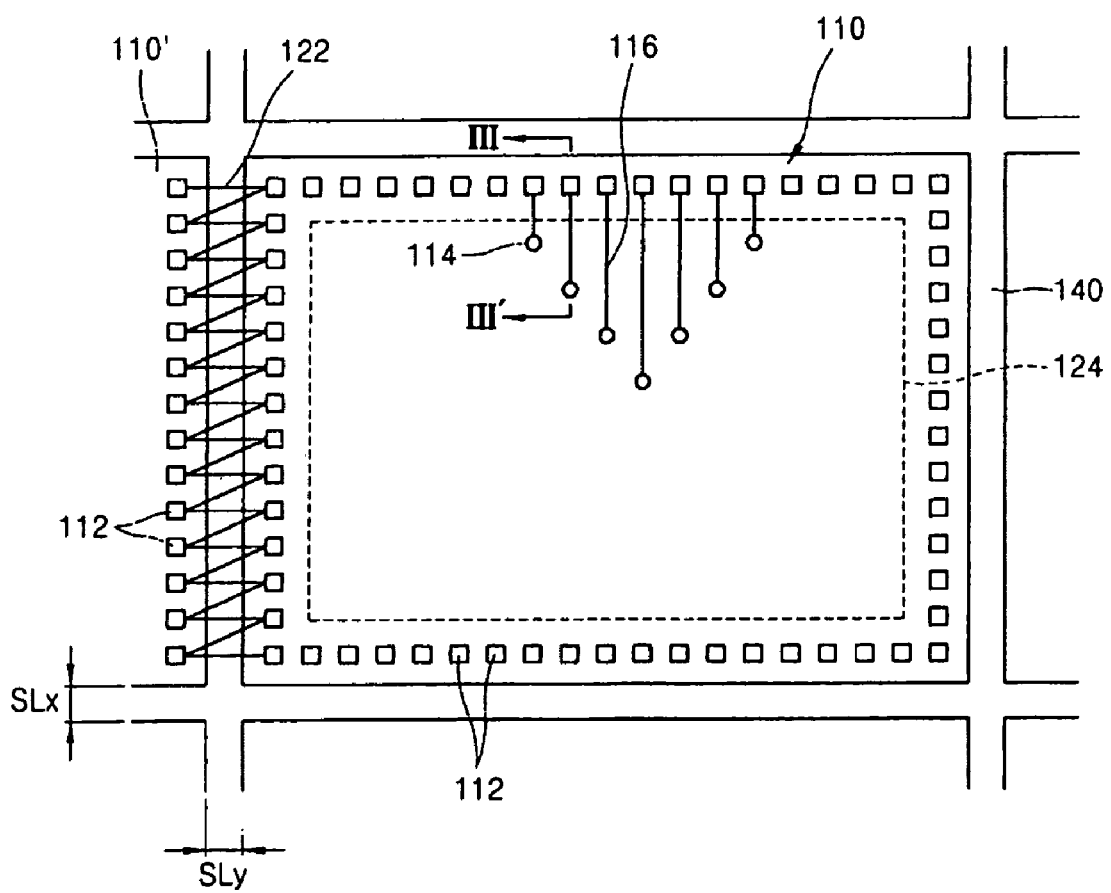
FIG. 2 is a magnified plan view of part II of FIG. 1.

FIG. 2 is a magnified plan view of part II of FIG. 1. A semiconductor package unit frame 110 included in the matrix type PCB 100 has bond fingers 112 which are disposed along an outermost edge of a top surface of the semiconductor package unit frame 110. The bond fingers 112 represent terminals that connect a portion of the semiconductor package unit frame 110 and bond pads of a semiconductor chip. Also, the bond fingers 112 are respectively connected to printed circuit patterns 116 via lands 114 which are closer to a center of the semiconductor package unit frame 110 than the bond fingers 112. The via lands 114 represent portions that connect printed circuit patterns on top and bottom surfaces of the semiconductor package unit frame 110.

Although not all illustrated in the drawings, all of the bond fingers 112 can be respectively connected to the printed circuit patterns 116 via the via lands 114. The via lands 114 are arranged in a region 124 in which a semiconductor chip is mounted and are located closer to a center of the semiconductor package unit frame 110 than the bond fingers 112. The via lands 114 are cross-connected to solder ball pads (not shown) formed on the bottom surface of the semiconductor package unit frame 110.

In an embodiment, the bond fingers 112 can be disposed along the outermost edge of the top surface of the semiconductor package unit frame 110, so as to maximally use the top surface of the semiconductor package unit frame 110 in a chip-scale package (CSP) type BGA semiconductor package that has many input/output (I/O) terminals in a semiconductor chip and that is 1.2 times larger than the semiconductor chip. That is, by including as many structures, such as the via lands 114, as possible in the region 124 in which the semiconductor chip is mounted, it is possible to form less printed circuit patterns outside of the region 124.

Accordingly, the bond fingers 112 in the semiconductor package unit frame 110 and bond fingers 112 in an adjacent semiconductor package unit frame 110', which is apart from the semiconductor package unit frame 110 by the scribe lane 140, are structurally cross-connected via a printed circuit pattern for plating 122. The printed circuit pattern for plating 122 represents a printed circuit pattern that connects all printed circuit patterns formed in a PCB, so as to plate the printed circuit patterns at one time when the PCB is manufactured. Such a printed circuit pattern for plating 122 is divided in a following cutting process using a saw blade, thus, there is no risk of a short.

The cutting process using the saw blade represents a cutting process in which the scribe lane 140 is cut using the saw blade that is a round-shaped rotating saw blade including a diamond piece. At this time, in order to prevent cut-off particles from contaminating a surface of the PCB, in general, the cutting process is performed by simultaneously spraying deionized (DI) water onto a portion of the scribe lane 140 that is being cut. However, PCB copper included in the cut fine particles contaminates the DI water to thus result in environmental contamination.

In an embodiment, a cutting process is performed using a laser, instead of using the saw blade. Thus, a width of the scribe lane 140 can be significantly lessened from the conventional 270 μm to instead fall between about 30 μm through about 60 μm in both X and Y directions. Such significant width reduction is due to use of the laser cutting process, which is more elaborate than the saw blade cutting process. Also, the printed circuit pattern for plating 122 is disposed zigzag to cross the scribe lane 140 and thus reduce malfunctions due to light that reflected from the printed circuit pattern for plating 122 when the laser cutting process is performed. In this manner, the width of the scribe lane 140 may be significantly lessened to reduce a size of a raw material, and the environmental contamination due to copper contamination may be solved since the laser cutting process is performed.

Figure 3:
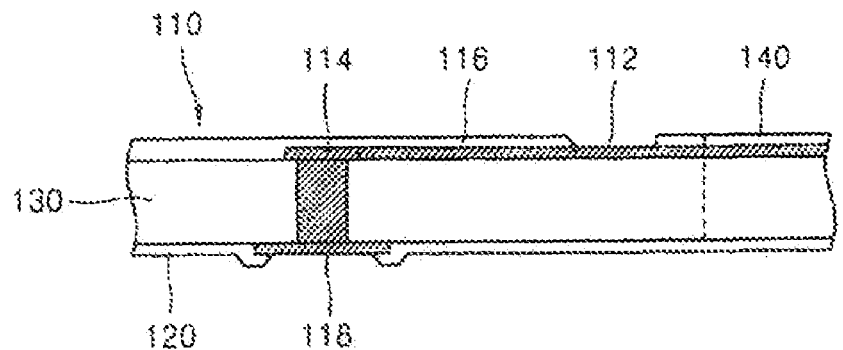
FIG. 3 is a cross-sectional view taken along line III-III of FIG. 2.

FIG. 3 is a cross-sectional view taken along line III-III of FIG. 2. The bond fingers 112 are formed on a top surface of the insulating substrate 130 so as to be adjacent to the scribe lane 140. The bond fingers 112 are connected to the printed circuit patterns 116 so as to be respectively connected to the via lands 114 arranged on the top surface of the insulating substrate 130. In an embodiment, the bond fingers 112 and the printed circuit pattern for plating 122 in the scribe lane 140 are formed in the same layer. The via lands 114 are respectively connected to solder ball pads 118 formed on a bottom surface of the insulating substrate 130.

The bond fingers 112 on the top surface of the insulating substrate 130 and the solder ball pads 118 on the bottom surface of the insulating substrate 130 are externally exposed for external connection, without being covered with a solder resist 120. Referring to FIG. 3, the via lands 114 are directly connected to the solder ball pads 118 but positions of the solder ball pads 118 may be changed by using another printed circuit pattern (not shown) formed on the top surface of the insulating substrate 130.

Figure 4:
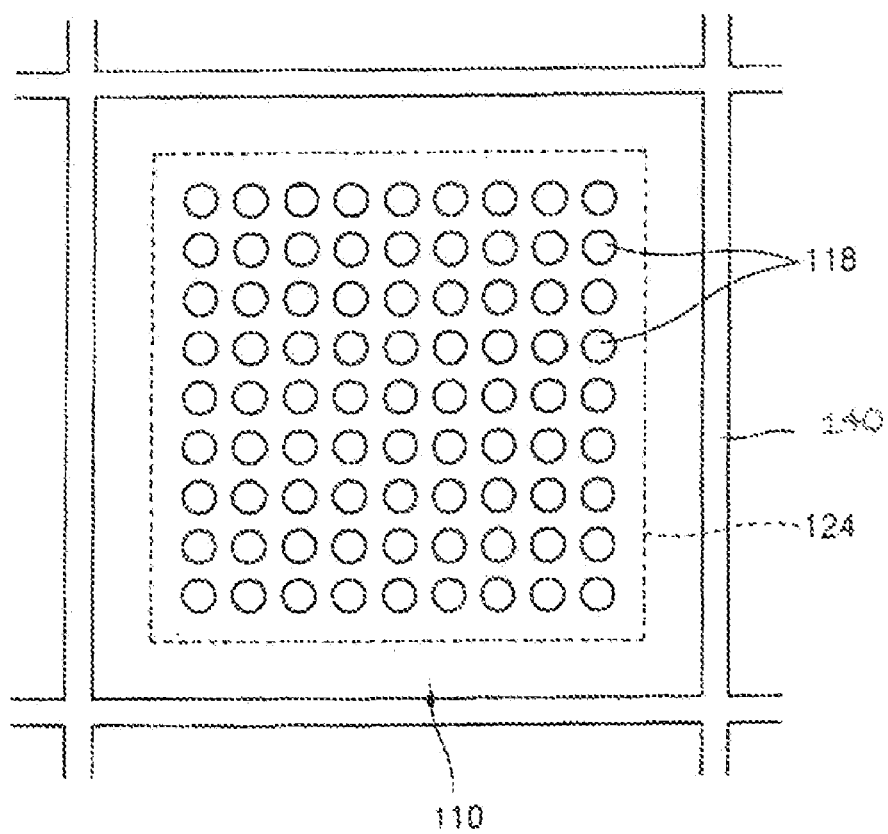
FIG. 4 is a rear view of the matrix type PCB having the saw line with a narrow width, according to the embodiment.

FIG. 4 is a rear view of the matrix type PCB 100 having the saw line with a narrow width, according to an embodiment. The solder ball pads 118 are matrix-formed on the bottom surface of the semiconductor package unit frame 110. Here, the solder ball pads 118 may be disposed in the region 124 in which the semiconductor chip is mounted.

In an embodiment, the printed circuit pattern for plating 122, which connects the adjacent semiconductor package unit frames 110 and 110', is implemented on top surfaces of the adjacent semiconductor package unit frames 110 and 110' via bond fingers 112. However, in another embodiment, the implementation may be accomplished instead by respectively connecting solder ball pads 118 on bottom surfaces of the adjacent semiconductor package unit frames 100 and 100'. However, in such an implementation, the connection between the outermost solder ball pads 118 located closer to the boundary of the region 124 may be easy but the connection between the solder ball pads 118 located inner to the outermost solder ball pads 118 may not be easy. It is because adjacent solder ball pads from among the solder ball pads 118 do not have a sufficient gap therebetween, so that a printed circuit pattern may not be sufficiently disposed across the gap.

Figure 5:
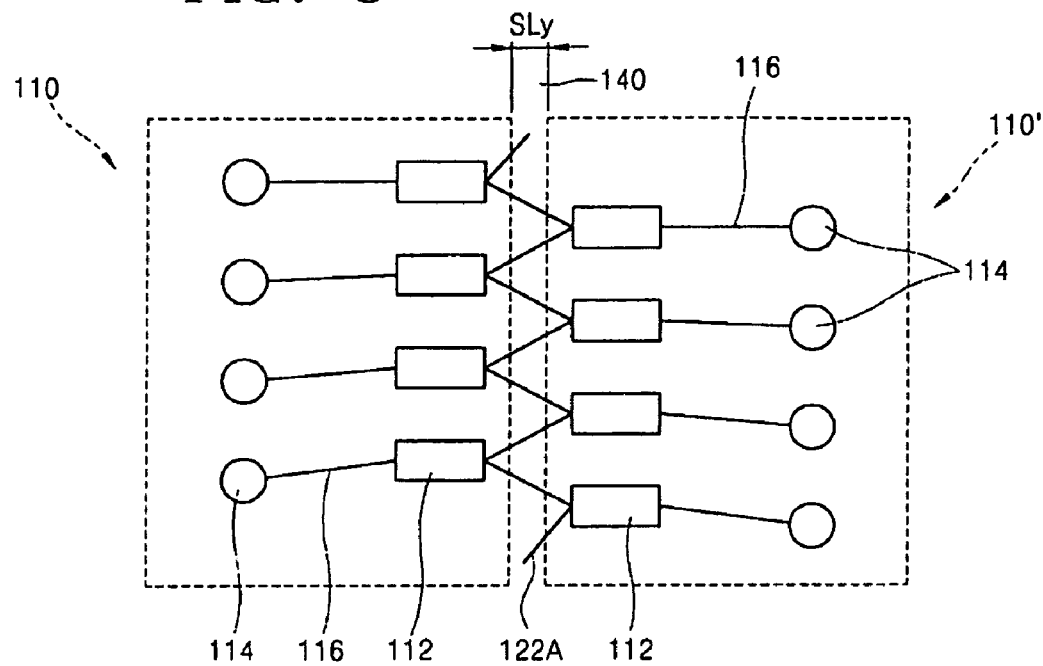
FIGS. 5 through 7 are plane views of shapes of a printed circuit pattern for plating in a matrix type PCB having a saw line with a narrow width, according to another embodiment.
Figure 6:
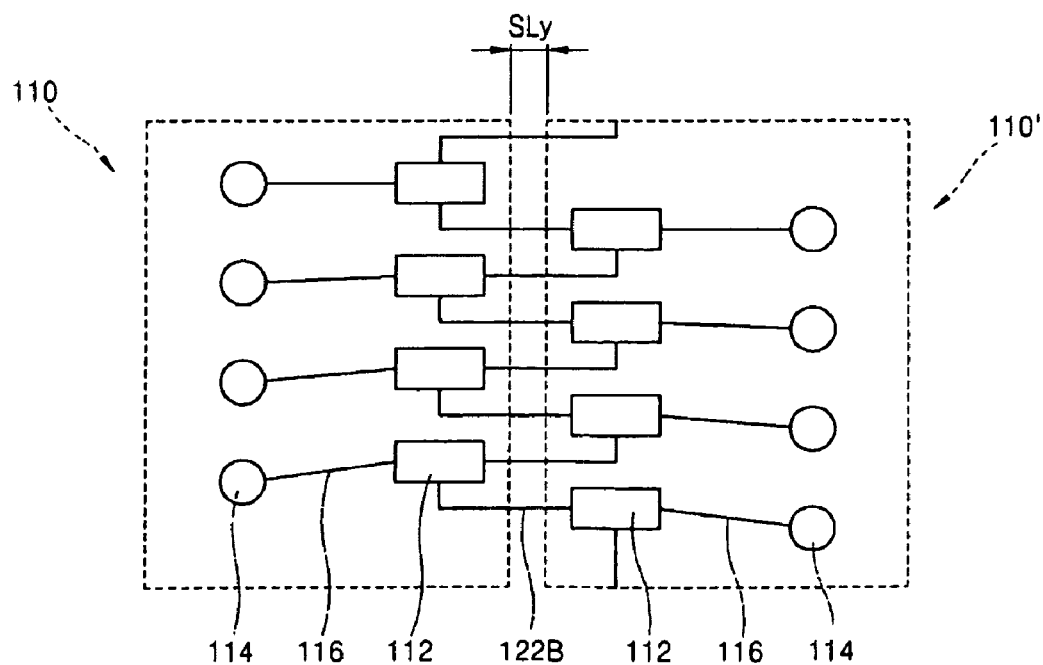
Figure 7:
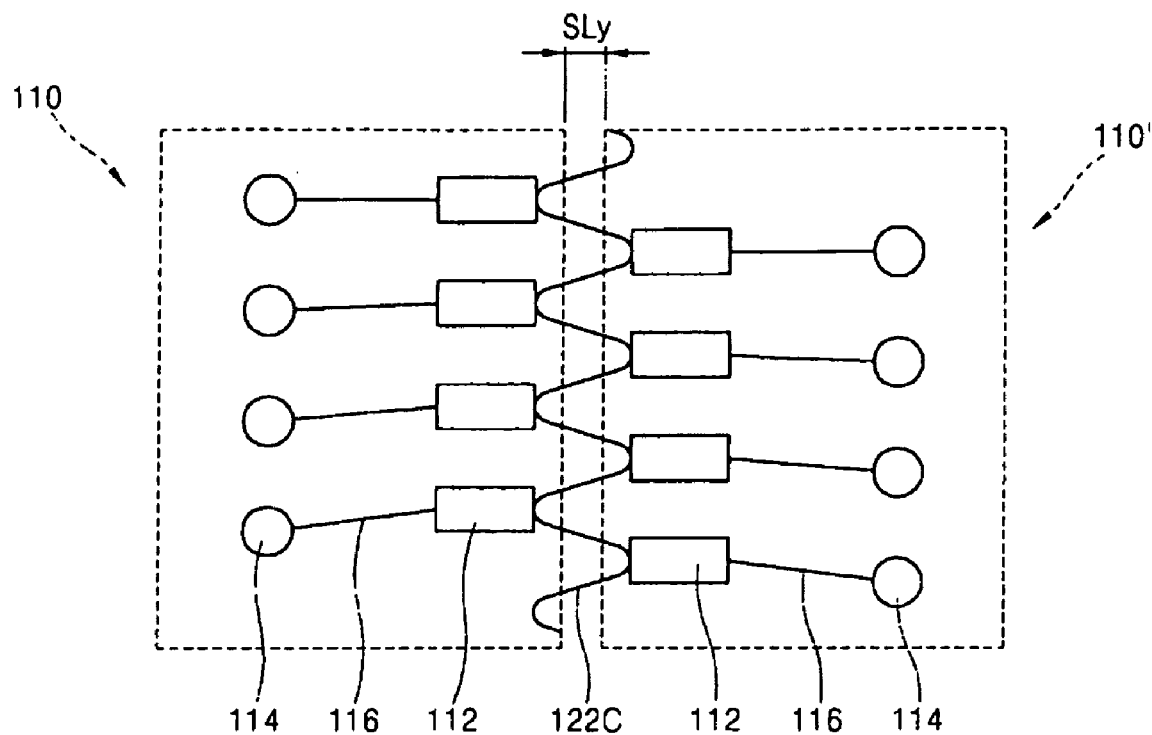

FIGS. 5 through 7 are plane views of shapes of a printed circuit pattern for plating 122 in a matrix type PCB having a saw line with a narrow width, according to another embodiment.

Referring to FIGS. 5 through 7, the printed circuit pattern for plating 122 that connects the adjacent semiconductor package unit frames numerals 110 and 110' may be a W-shaped printed circuit pattern for plating 122A. For example, the W-shaped printed circuit pattern for plating 122A can couple bond fingers 112 of adjacent semiconductor package unit frames 100 and 100' through a substantially linear pattern. As illustrated in FIG. 5, the printed circuit pattern for plating 122 may be a consecutive L-shaped printed circuit pattern for plating 122B. For example, the printed circuit for plating 122 can have a first segment exiting from a bond finger 112 in a direction substantially parallel to the scribe lane 140 and a second segment extending across the scribe lane and substantially perpendicular to the scribe lane. As illustrated in FIG. 6, the printed circuit for plating 122 may be an S-shaped printed circuit pattern for plating 122C, as illustrated in FIG. 7.

A characteristic of such printed circuit patterns for plating 122A, 122B, and 122C is that the printed circuit patterns for plating 122A, 122B, and 122C are formed to zigzag across a scribe lane (SL) area, and thus, not to be parallel with the scribe lane (SL) area. When the printed circuit patterns for plating 122B are parallel to the scribe lane (SL) area, those segments are not within the scribe lane (SL) area. By doing so, when a laser cutting process is performed, an affect due to light reflecting from the printed circuit pattern for plating 122 may be minimized. Also, even though a small misalignment may occur or a cutting path may be shifted in left and right directions when the laser cutting process is performed, a short between adjacent bond fingers 112 may be prevented.

Figure 8:
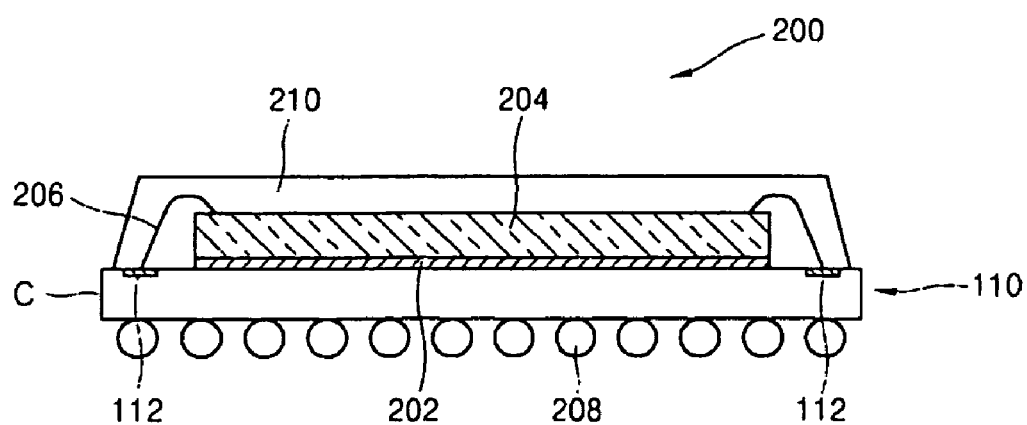
FIG. 8 is a sectional view of a semiconductor package including a semiconductor package unit frame, according to another embodiment.

FIG. 8 is a sectional view of a semiconductor package including a semiconductor package unit frame, according to another embodiment. The semiconductor package 200 is a BGA semiconductor package obtained by laser cutting the semiconductor package unit frame 110 from the matrix type PCB 100.

First, the semiconductor package 200 according to the present embodiment uses the semiconductor package unit frame 110 as a base frame, wherein the semiconductor package unit frame 110 is achieved by laser cutting (refer to C of FIG. 8) the matrix type PCB 100 having a scribe lane that is the saw line with a narrow width. At this time, a surface condition of a cross-section (refer to C of FIG. 8) of the semiconductor package unit frame 110 becomes different between that of a laser cutting and that of a saw blade cutting, and thus, an easy discrimination may be performed via an analysis afterwards. Also, a shape of a printed circuit pattern for plating may be recognized by referring to the shape that remains after the laser cutting is performed. A structural characteristic of this embodiment is that the bond fingers 112 are arranged close to an outermost edge of the semiconductor package unit frame 110.

A semiconductor chip 204 is mounted on the semiconductor package unit frame 110 by using an adhesive 202. The adhesive 202 may be an adhesive tape, a liquid epoxy, or the like. A size of the semiconductor package unit frame 110 may be about 1.2 times greater than of the semiconductor chip 204.

Also, the semiconductor package 200 according to the current embodiment includes wires 206 which connect bond pads (not shown) of the semiconductor chip 204 and the bond fingers 112 of the semiconductor package unit frame 110, and an encapsulation member 210 which encapsulates the top surface of the semiconductor package unit frame 110, the semiconductor chip 204, and the wires 206. The semiconductor package 200 includes solder balls 208 attached on a solder ball pad (not shown) on the bottom surface of the semiconductor package unit frame 110. Although wires 206 have been given as an example, other conductors, such as ribbons, multiple wires, or the like can be used.

Figure 9:
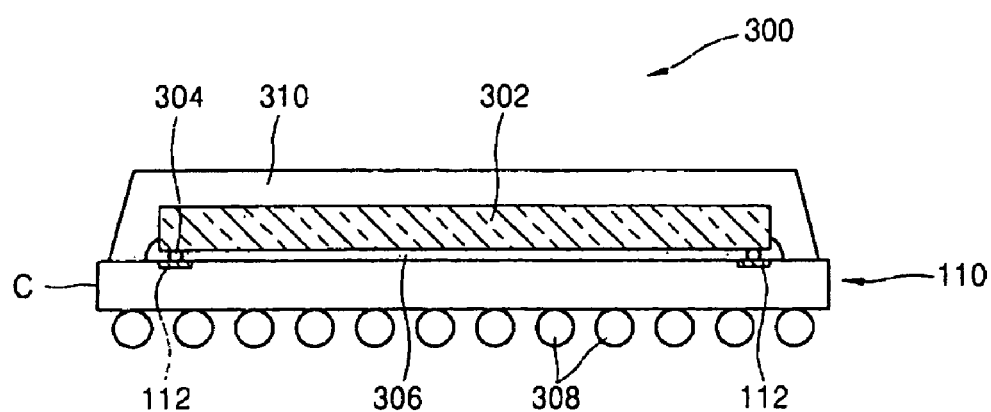
FIG. 9 is a sectional view of a semiconductor package including a semiconductor package unit frame, according to another embodiment.

FIG. 9 is a sectional view of a semiconductor package including a semiconductor package unit frame, according to another embodiment. The semiconductor package 300 according to the this embodiment uses the semiconductor package unit frame 110 as a unit frame, wherein the semiconductor package unit frame 110 is obtained by laser cutting (refer to C of FIG. 9) the matrix type PCB 100.

A semiconductor chip 302 is mounted on the bond fingers 112 of the semiconductor package unit frame 110 via bumps 304 so as to be arranged on the semiconductor package unit frame 110. A gap between the semiconductor chip 302 and the semiconductor package unit frame 110 may be selectively filled with underfill 306 that is formed of an epoxy material, for example. Also, the semiconductor package 300 according to the current embodiment includes an encapsulation 310 which encapsulates the top surface of the semiconductor package unit frame 110 and the semiconductor chip 302. Solder balls 308 are attached on a solder ball pad (not shown) on the bottom surface of the semiconductor package unit frame 110.

Figure 10:
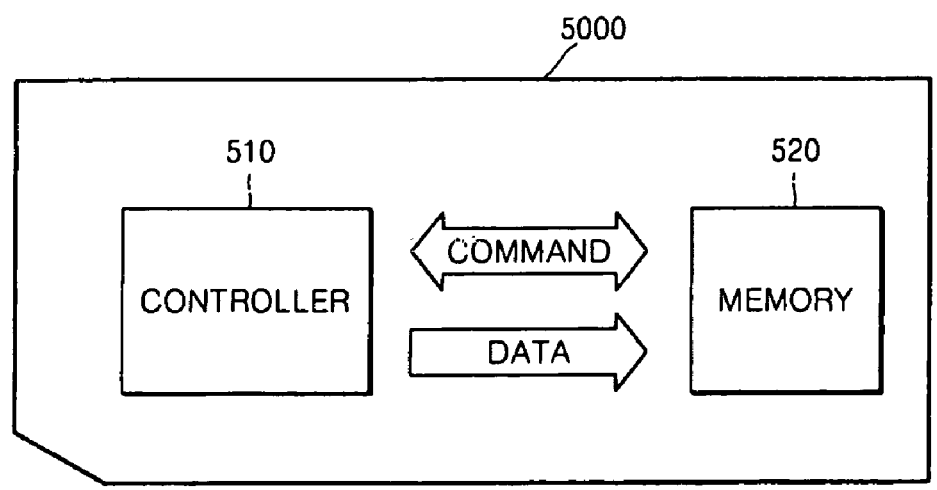
FIG. 10 is a block diagram in which a semiconductor package is applied to a memory card, according to another embodiment.

FIG. 10 is a block diagram in which a semiconductor package is applied to a memory card 5000, according to another embodiment. A controller 510 and a memory 520 may be disposed to exchange an electrical signal. For example, when a command is transmitted from the controller 510, the memory 520 may transmit data according to the command. The memory 520 may include non-volatile memory devices according to an embodiment. The non-volatile memory devices according to an embodiment may be disposed as a memory array (not shown) corresponding to a logic gate design so as to have a "NAND" and "NOR" structure, as well known to one of ordinary skill in the art. Columns and rows are disposed in the memory array which may form at least one memory array bank (not shown). The memory 520 may include the memory array or the memory array bank. Also, the memory card 5000 may further include a column decoder (not shown), a row decoder (not shown), I/O buffers (not shown), and/or a control register (not shown) so as to drive the memory array bank. Such a memory card 5000 may be applied to various memory card devices such as a memory stick card, a smart media (SM) card, a secure digital (SD) card, a mini SD card, and a multi media card (MMC).

Figure 11:
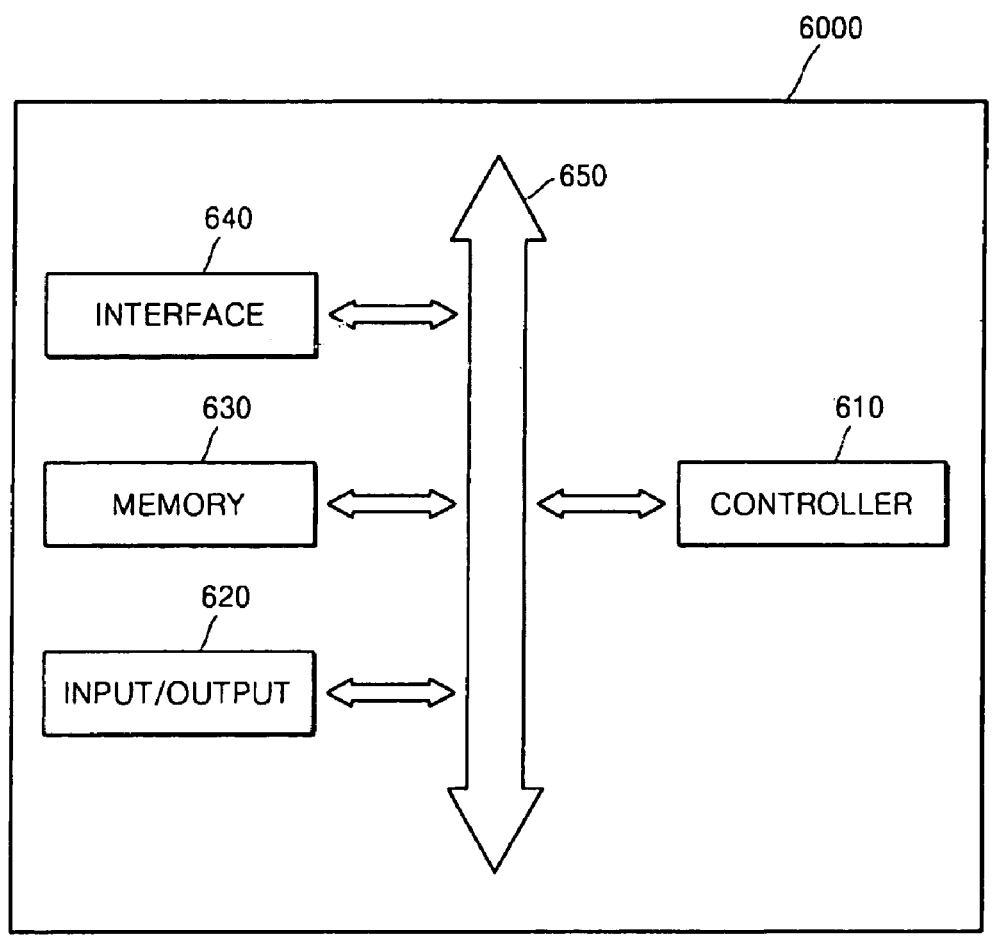
FIG. 11 is a diagram of a system to which a semiconductor package is applied, according to another embodiment.

FIG. 11 is a diagram of a system 6000 to which a semiconductor package is applied, according to another embodiment. The system 6000 may include a controller 610, an Input/Output (I/O) unit 620, a memory 630, and an interface 640. The system 6000 may be a mobile system or a system for transmitting or receiving information. The mobile system may be a personal digital assistant (PDA), a portable computer, a web tablet, a wireless phone, a mobile phone, a digital music player, or a memory card. The controller 610 may function to execute a program and to control the system 6000. For example, the controller 610 may be a microprocessor, a digital signal processor, a microcontroller or the like. The I/O unit 620 may function to input or output data of the system 6000. The system 6000 may be connected to an external device such as a personal computer or a network by using I/O unit 620, so as to exchange data with the external device. The I/O unit 620 may be a keypad, a keyboard, or a display device. The memory 630 may store code and/or data for operation of the controller 610, and/or may store data processed by the controller 610. The memory 630 may include a non-volatile memory device according to an embodiment. The interface 640 may be a data transmission passage between the system 6000 and another external device. The controller 610, the I/O unit 620, the memory 630, and the interface 640 may cross-communicate via a bus 650. Such a system 6000 may be applied to a mobile phone, a MPEG Audio Layer-3 (MP3) player, a navigation device, a portable multimedia player (PMP), a solid state disk (SSD), or household appliances.

While embodiment have been particularly shown and described with reference to the drawings, it will be understood that various changes in form and details may be made therein without departing from the spirit and scope of the following claims.

The invention claimed is:

1. A PCB (printed circuit board) for manufacturing a semiconductor package, the PCB comprising:
   a plurality of semiconductor package unit frames;
   a scribe lane dividing the plurality of semiconductor package unit frames; and
   a first printed circuit pattern for plating directly connected to a plurality of bond fingers on the semiconductor package unit frames and disposed to cross the scribe lane between adjacent semiconductor package unit frames,
   wherein each semiconductor package unit frame comprises:
      a plurality of via lands disposed closer to the center of the semiconductor package unit frame than a set of the plurality of bond fingers corresponding to the semiconductor package unit frame;
      a plurality of second printed circuit patterns directly connecting the set of the plurality of bond fingers to the plurality of via lands, and
   wherein the plurality of bond fingers directly contact the first printed circuit pattern for plating and are connected to the via lands of semiconductor package unit frames through the second printed circuit patterns, such that the bond fingers are disposed between the first printed circuit pattern for plating and the plurality of via lands in a corresponding semiconductor package unit frame.

2. The PCB of claim 1, wherein each of the bond fingers are disposed in an outermost edge of the corresponding semiconductor package unit frame.

3. The PCB of claim 1, wherein the via lands of a semiconductor package unit frame connect one of a top surface and a bottom surface of the semiconductor package unit frame to the second printed circuit patterns.

4. The PCB of claim 3, wherein each semiconductor package unit frame comprises a plurality of solder ball pads formed in another surface other than a surface on which the bond fingers are arranged, and are connected to the bond fingers via the via lands.

5. The PCB of claim 1, wherein a width of the scribe lane is between 30 μm and 100 μm.

6. The PCB of claim 1, wherein at least one of the semiconductor package unit frames is for a BGA (ball grid array) semiconductor package.

7. The PCB of claim 1, wherein the PCB comprises a double-layered PCB.

8. The PCB of claim 1, wherein the PCB comprises a multi-layered PCB.

9. The PCB of claim 1, wherein a shape of the printed circuit pattern for plating includes at least one selected from the group consisting of an S-shape, a W-shape, and an L-shape.

10. The PCB of claim 1, wherein the semiconductor package unit frames are arrayed on a matrix type PCB.

11. The PCB of claim 1, wherein the first printed circuit pattern for plating and the bond fingers are formed in the same layer.

12. A semiconductor package, comprising:
   a semiconductor package unit frame obtained by laser cutting the PCB of claim 1;
   a semiconductor chip mounted on a top surface of the semiconductor package unit frame;
   a plurality of conductors that connect bond pads of the semiconductor chip and the set of the plurality of bond fingers of the semiconductor package unit frame; and
   a plurality of solder balls attached on a solder ball pad on a bottom surface of the semiconductor package unit frame.

13. The semiconductor package of claim 12, wherein the set of the plurality of bond fingers is disposed in an outermost edge of the semiconductor package unit frame.

14. The semiconductor package of claim 13, wherein the plurality of via lands disposed closer to the center of the semiconductor package unit frame than the set of the plurality of bond fingers corresponding to the semiconductor package unit frame are formed in a region in which the semiconductor chip is mounted.

15. The semiconductor package of claim 12, further comprising a printed circuit pattern for plating, which is connected to the set of the plurality of bond fingers in the semiconductor package unit frame so as to extend to at least one edge of the semiconductor package unit frame, and having a shape formed by laser cutting one of an S-shape, a W-shape, and an L-shape.

16. A semiconductor package, comprising:
   a semiconductor package unit frame of the plurality of semiconductor package unit frames obtained by laser cutting the PCB of claim 1;
   a semiconductor chip mounted on the set of the plurality of bond fingers of the semiconductor package unit frame via a plurality of bumps so as to be arranged on a top surface of the semiconductor package unit frame; and
   a plurality of solder balls attached on a solder ball pad on a bottom surface of the semiconductor package unit frame.

17. The semiconductor package of claim 16, further comprising an underfill filling a gap between the semiconductor package unit frame and the semiconductor chip.

18. The semiconductor package of claim 16, further comprising an encapsulation encapsulating the top surface of the semiconductor package unit frame, and the semiconductor chip.

19. The semiconductor package of claim 16, wherein the set of the plurality of bond fingers is disposed in an outermost edge of the semiconductor package unit frame.

20. The semiconductor package of claim 16, further comprising a printed circuit pattern for plating connected to the set of the plurality of bond fingers in the semiconductor package unit frame so as to extend toward at least one edge of the semiconductor package unit frame, and having a shape formed by laser cutting one of an S-shape, a W-shape, and an L-shape.

* * * * *